(12) United States Patent
Rumer

(10) Patent No.: US 7,640,647 B2
(45) Date of Patent: Jan. 5, 2010

(54) METHOD OF ASSEMBLING A PACKAGED HIGH FREQUENCY CIRCUIT MODULE

(75) Inventor: Simon Leonard Rumer, Portsmouth (GB)

(73) Assignee: Astrium Limited, Hertfordshire (GB)

( * ) Notice: Subject to any disclaimer, the term of this patent is extended or adjusted under 35 U.S.C. 154(b) by 201 days.

(21) Appl. No.: 10/567,377

(22) PCT Filed: Jan. 23, 2006

(86) PCT No.: PCT/GB2006/050015

§ 371 (c)(1),
(2), (4) Date: Feb. 7, 2006

(87) PCT Pub. No.: WO2006/079849

PCT Pub. Date: Aug. 3, 2006

(65) Prior Publication Data

US 2007/0139143 A1     Jun. 21, 2007

(30) Foreign Application Priority Data

Jan. 29, 2005 (EP) .................................. 05250485
Jan. 29, 2005 (GB) .................................. 0501871.8

(51) Int. Cl.
*G01R 3/00* (2006.01)

(52) U.S. Cl. ........................... 29/595; 29/592.1; 29/831; 29/842; 29/846; 29/854; 156/256; 333/219.1; 333/230; 257/E21.499; 257/E23.009; 257/600; 438/6; 438/15; 438/337; 438/462

(58) Field of Classification Search ................ 29/592.1, 29/595, 831, 842, 846, 854; 156/256; 438/6, 438/15, 337, 462; 257/E21.499, E23.009, 257/600; 333/219.1, 230
See application file for complete search history.

(56) References Cited

U.S. PATENT DOCUMENTS 5,911,112 A     6/1999 Kirkman (Continued)

FOREIGN PATENT DOCUMENTS

EP        0 408 228 A2     1/1991

(Continued)

OTHER PUBLICATIONS

International Preliminary Report on Patentability and of the Written Opinion issued in PCT/GB2006/050015; Jul. 31, 2007; EPO, Geneva, CH.

(Continued)

*Primary Examiner*—Paul D Kim
(74) *Attorney, Agent, or Firm*—Buchanan Ingersoll & Rooney PC

(57) ABSTRACT

Projecting elongate stub walls are provided on the planar surfaces of a substrate at positions where bonding of the substrate to a clamping lid or base is to be carried out. On firing of the substrate, the surfaces thereof are mechanically processed but since the stub walls protrude from the substrate, the grinding and polishing tools make contact with the surfaces of these stub walls, rather than with the entire substrate surface. As a result, the area of the substrate to be processed is minimised and problems with dishing and erosion are alleviated. This allows the clamping lid, or frame to be bonded, using conventional conductive adhesive processes, avoiding the cracking and stress problems associated with non-uniformity of the surface of the ceramic substrates.

16 Claims, 1 Drawing Sheet

U.S. PATENT DOCUMENTS

| | | | |
|---|---|---|---|
| 6,046,074 A * | 4/2000 | McHerron et al. | 438/119 |
| 6,139,666 A | 10/2000 | Fasano et al. | |
| 6,140,698 A | 10/2000 | Damphousse et al. | |
| 6,709,749 B1 | 3/2004 | Kumar et al. | |
| 6,924,429 B2 * | 8/2005 | Kasai et al. | 174/565 |
| 2004/0132900 A1 | 7/2004 | Sachdev et al. | |
| 2004/0159960 A1 | 8/2004 | Fujiwara et al. | |

FOREIGN PATENT DOCUMENTS

| | | |
|---|---|---|
| JP | 64-041183 | 2/1989 |
| JP | 2001-209748 | 8/1989 |
| JP | 2005-114955 | 11/1993 |
| JP | 2000-196050 | 7/2000 |
| JP | 2004-214469 | 7/2004 |

OTHER PUBLICATIONS

*United Kingdom Search Report dated Jun. 16, 2005.
*European Search Report dated Jul. 18, 2005.
Notice of Reasons for Rejection (English-language translation) dated Mar. 17, 2009 in Corresponding Japanese Patent Application No. 2007-500303 (3 pages).

* cited by examiner

METHOD OF ASSEMBLING A PACKAGED HIGH FREQUENCY CIRCUIT MODULE

This application is based on and claims priority to Great Britain Application No. 0501871.8, filed on Jan. 29, 2005, European Application No. 05250485.9, filed Jan. 29, 2005 and International Application No. PCT/GB2006/050015, filed Jan. 23, 2006 designating the U.S., the entire contents of which are hereby incorporated by reference in their entireties.

FIELD

The invention relates to the mechanical packaging of radio frequency (RF) electronic structures and, in particular, the provision of packaged circuits used for high frequency electronic modules and small subsystems. The packaging structures are particularly suitable for, but not limited to, electronic modules used within artificial communications satellite electronic equipment.

BACKGROUND

In the field of satellite communications, the packaging of electronic circuits and sub-systems, within the satellite payload, presents some significant survival challenges due to the extreme conditions experienced in operation. For example, the packaging must provide both mechanical and electrical isolation from the inside to outside of the package in order to prevent unwanted signal radiation and, by reciprocity, provide protection of the electronics from external signals that may cause interference to the equipment operation. The packaging must also be able to tolerate rapid de-pressurisation and harsh vibration environment experienced during the ascent of an artificial Satellite during its launch phase, particularly at lift-off. The packaging is subjected to the extreme variations in temperature that are experienced in space, particularly when the satellite passes into Solar eclipse during its orbit and must be able to tolerate the twice-daily thermal shock experienced by the Satellite crossing the Solar/Geo terminator during its operational lifetime. This equates to approximately 11,000 cycles for a typical 15-year geostationary mission and up to 60,000 cycles for Satellites operating in polar or highly elliptical orbits.

Electronic modules, including those used within Satellite payloads, often make extensive use of low electrical loss ceramic materials as substrates, to provide a base on which RF components are mounted and interconnected with conducting tracks. One or more tracks may be formed on one or more layers throughout the thickness of the substrate using manufacturing techniques such as High Temperature Co-fired Ceramic (HTCC) and Low Temperature Co-fired Ceramic (LTCC). These multi-layer ceramic substrates are, of necessity, further integrated into machined, or otherwise manufactured, metal housings so as to form self-contained, electrically screened, electronic modules. The use of metal housings does not exclude other means of manufacture, which are not implicitly constructed of solid base metals but make use of non-conducting materials with suitable exterior metalisations so as to provide the desired electrical screening.

On selecting an appropriate ceramic material for use as a substrate, many properties and features are desirable. For example, the material should exhibit good mechanical temperature stability coupled with a low coefficient of linear expansion and good electrical property stability with variation in temperature. Moreover, the relative ease with which track metallisations can be deposited onto the materials surface, including a buried layer capability, the adhesion of the metallised tracking to the surface of the substrate and the relative ease with which connections can be made to the metallised tracking are considerations. The substrate material should also be able to withstand the high temperatures seen during component attachment operations, have good mechanical handling properties and good electrical and mechanical repeatability.

Whilst typical ceramic materials are well suited to providing a stable substrate suitable for RF circuitry, the usage of such a material often presents significant difficulties when integrating the substrates into a metal housing. The method of fixing the ceramic substrate within the metal housing is key to a physically robust and electrically sound design. A number of methods have been used to fix the circuit substrate to its housing.

For example, it is commonplace to fix a ceramic substrate to its metallic housing using electrically conductive adhesives so as to provide the required RF performance in terms of electrical isolation. Many electrically conductive adhesives are composed of traditional non-conductive thermosetting adhesives, like multi-part epoxy resins, for example, that are mixed with a critical proportion of finite sized, solid metal, conductive particulate. Under normal conditions the mixture performs poorly as an electrical conductor because only a small percentage of the metallic particulate is in continuous physical contact. With the application of mechanical pressure, and due to the relatively low viscosity of the uncured resin, a larger proportion of the metallic particulate can come into intimate physical contact thus increasing the electrical conductivity. Additionally, by elevating the temperature, under the stated condition of increased pressure, the viscosity of the resin mixture is further reduced allowing still more metallic particulate to come into contact and, at the same time, accelerating the desired catalytic reaction to cure the resin. Ultimately, the cured resin is set in a position that prevents the bulk of the contacting solid metal conductive particulate from separating once the applied mechanical pressure is removed.

An example of the use of a conductive adhesive can be seen in FIG. 1, which shows a typical module that contains a ceramic substrate 2 mounted into a machined metal housing 1. A plurality of conductive tracks 6,7 are formed on the surface of substrate 2 which may contain a plurality of circuit layers that can be electrically interconnected to its top and bottom layers, as shown, using known via-hole technology. The ceramic substrate 2 is held in place with a conductive adhesive 3 in contact with the top and bottom conductive layers simultaneously. Above the ceramic substrate is a clamping lid, or frame, 4 which is in electrical contact with an outer ring track of the substrate, as well as providing an internal contacting wall 5. In FIG. 1, wall 5 is disposed centrally, for example only, but it should be understood that there maybe many such internal walls depending on the required substrate circuit complexity. The function of the wall 5 is to provide electrical isolation from RF track 6 to an adjacent RF track 7. Additionally, the floor of the housing 1 may be provided with apertures allowing for conductive tracks, similar to tracks 6 and 7, on the bottom layer of the substrate 2, together with electronic components 8 mounted thereto. To maintain RF integrity and ultimate electrical isolation, the housing 1 is also provided with a bottom lid 9. Fixing of the top and bottom lids 4, 9 may be achieved using conductive adhesives, soldering or beam welding schemes.

In the above arrangement, it is critical that the substrate fixing adhesive make good electrical contact with the clamping lid 4, and the housing floor at the outer ring track as well as the internal walls 5, or webs, simultaneously.

A significant problem with such adhesive substrate fixing techniques is the planar surface uniformity or "flatness" of the two surfaces to be bonded. If either of the two surfaces are not precisely parallel and uniform, some areas will bear the majority of the applied mechanical load during the pressure application stage of the manufacturing process, prior to the adhesive curing cycle, while other areas will bear a somewhat smaller mechanical load. On completion of the curing process, the conductivity achieved will be high in areas of high pressure and low in areas of low pressure. This situation leads to uncontrolled electrical isolation across the top and bottom regions of the substrate housing which may effect the circuit performance and ultimately may lead to failure of the package functionality.

In addition, when the surface of the substrate is not precisely uniform as compared to its housing, the risk of cracking of the substrate increases during the pressure application stage of the manufacturing process. The electrical effects of such a crack are not always apparent at initial electrical testing and so there is a risk that, in a launched Satellite for example, the crack may further propagate into or across the substrate during mission life and lead to the failure of equipment.

The use of "as fired" ceramics for circuit realisation is limited by the degree of shrinkage and uniformity of the surface achieved during the materials sintering process. In general, surface planarisation of the substrate is necessary prior to RF component fabrication due to large surface roughness of fired ceramic parts. The surface roughness is determined both by the intrinsic roughness of dielectric sheets and more typically by buried features underneath the surface. In the past, arbitrary size limitations for ceramic circuits using conductive adhesive fixing have been imposed. For this arbitrary choice of size, improved surface uniformity can be achieved by lapping and surface polishing but this technique becomes uneconomic to implement for larger substrates. For example, surface grinding of both the top and bottom planes of a 100 mm 2 substrate so as to achieve parallel surfaces with the required surface uniformity may take several days. Moreover, ceramic polishing of large surfaces can lead to other common problems, such as dishing and erosion, which are forms of local planarisation where certain areas of the wafer polish faster than others. The use of a number of smaller substrate tiles, with interconnecting bond wires has been found to be a more economic approach to achieving the desired surface uniformity, but in many cases, overall electrical performance is compromised.

Today, in the field of satellite communications, the design of satellite payloads is becoming ever more complex as the demand for increased functionality, provided by a single payload, is driven by the desire to minimise costs. All satellite payloads are, in principal, designed to be as small and with as low a mass as possible but with the continuing quest for increased functionality and minimum costs, there is a clear conflict of requirement. One way of resolving this situation is to design packaged electronic circuits with higher levels of integration so as to reduce the number of discrete packages needed for a payload with increased functionality. The introduction of HTCC and LTCC technologies has facilitated a certain degree of increased functional integration due to the multi-layer capability inherent in these techniques but, notwithstanding, the desire still exists to package larger ceramic substrates, as well as, utilising multiple circuit layers.

Increased functionality may be achieved, for example, by packaging a larger number of electrically independent RF signal channels within one multi-layer module. However, the independent nature of such signal channels, in close physical proximity, results in more demanding internal RF isolation requirements that must be provided for within the metal housing. This, in turn, means that the grounding of the substrate tracking to the internal walls of the housing must often be of better quality than has been previously been available for less complex packages.

The use of a conductive adhesive to fix the substrate to its housing as described above with reference to FIG. 1, is clearly only practical when surface of the ceramic substrate is uniform and parallel to the mating features of the metal housing to which it is to be fixed, in order to avoid cracking or stressing of the substrate, on fixing to the housing prior to the adhesive curing process. The risk associated with this problem is particularly high for ceramic substrates that are manufactured using HTCC and LTCC processes and which are capable of being arbitrarily large.

In summary, the existing assembly technique of using a conductive adhesive so as to fix a ceramic substrate into a machined, or otherwise manufactured, housing, suffers from relatively poor performance due to detrimental effects associated with non-uniformity of the surface of the ceramic substrates used. In particular, the isolation parameter, associated with the bonding conductivity, usually decreases as the physical size of the ceramic substrate increases.

SUMMARY

It is an object of the present invention to alleviate these problems and to improve the packaged performance of larger multi-layer substrate assemblies so that increased functionality can be achieved without unduly compromising other characteristics of the modules.

It is a further object of the invention to provide improved techniques of fixing large ceramic based multi-layer circuit substrates to a housing structure that is not only mechanically robust but also provides the necessary electrical properties known to be critical at high radio frequencies.

From a first aspect, the invention relates to a method of assembling a packaged high frequency circuit module including the steps of providing a ceramic substrate having one or more elongate stub walls projecting from a planar surface thereof; firing the ceramic substrate, processing the surface of the substrate until the planar surfaces of the elongate stub walls are uniform and parallel, applying a conductive adhesive to the processed surfaces of the stub walls and placing a housing lid over the substrate, the lid having one or more members projecting from a planar surface thereof so that the members align with the stub walls of the substrate to form a composite structure In a preferred embodiment, the stub walls extend, at least partially, around the periphery of the planar surface of the substrate but one or more stub walls may also project from the internal surface of the substrate. The elongate stub walls may project from both the upper and lower planar surface of the substrate with top and bottom housing lids being mounted thereon.

Processing of the substrate surface preferably comprises grinding of the surface but lapping and/or polishing the surface may also be carried out if required. On placing the housing lid over the substrate pressure is applied to the composite structure and curing of the conductive adhesive is carried out.

From a second aspect, the invention resides in a high frequency circuit module comprising a ceramic substrate having one or more elongate stub walls projecting from a planar surface thereof, the planar surfaces of the stub walls having been processed so that they are uniform and parallel, a conductive adhesive layer on the processed surfaces of the stub walls and a housing lid mounted over the substrate, the lid having one or more members projecting from a planar surface thereof so that the members align with the stub walls of the substrate to form a composite structure.

DESCRIPTION OF THE DRAWINGS

An embodiment of the invention will now be described, by way of example only, by reference to the drawings, in which:

FIG. 3 is a cross-sectional view of the multi-layer ceramic substrate of

Figure 2:
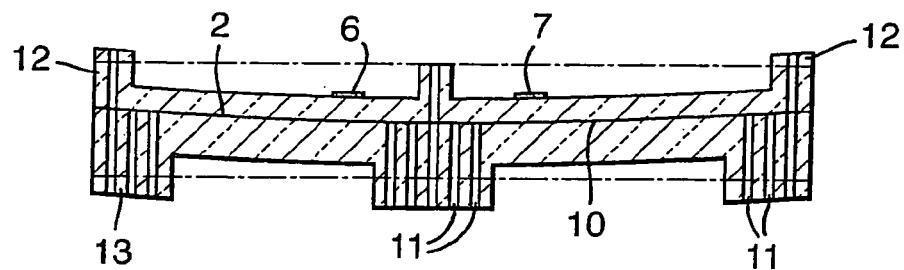
FIG. 2 is a distorted cross-sectional view of a preferred embodiment of the invention, showing a multi-layer ceramic substrate with electrical connections formed through the layers and indicating two parallel planes corresponding to the top and bottom of a ceramic stub wall of a clamping lid or frame to which the substrate is to be fixed.

DETAILED DESCRIPTION FIG. 2 assembled within in a metallic housing.

FIG. 2 illustrates a cross section of a ceramic substrate according to a preferred embodiment of the present invention. For illustrative purposes only, the upper and lower surfaces of the fired ceramic substrate are curved so as to indicate the planar surface uniformity distortion caused by the manufacturing process discussed above. However, it should be understood that, in reality, the distortion would be in the form of irregularities over the entire surface of the substrate.

The substrate 2 may comprise several conductive layers (not shown) which are insulated from each other by means of a dielectric material. Conductive RF signal tracks 6 and 7 are formed in a first conductive layer which is defined as the first conductive layer starting from the upper surface of the substrate 2. A ground plane 10 is formed in another conductive layer adjacent the first conductive layer. Substrate 2 includes a plurality of via-holes for making a connection from one conductive plane of substrate 2 to another. It should be understood that there could be any number of additional circuit layers below the RF ground plane as made available by the HTCC and LTCC manufacturing process.

Figure 1:
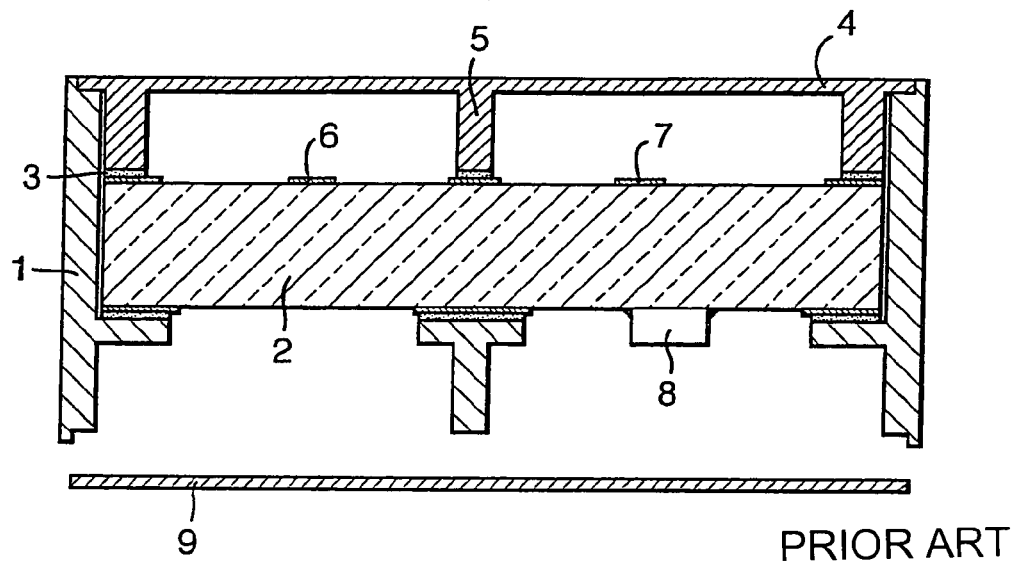
FIG. 1 is a schematic cross-sectional view of a known multi-layer ceramic substrate packaged within a metallic housing.

During firing of the ceramic, protruding stub walls 12 are formed in the outer ring track region of the substrate and at one or more other locations on the internal surface of the substrate 2. These location of these stub walls 12 on the substrate 2 corresponds to the positions of walls or webs of a clamping lid or frame (not shown) which forms part of the metallic housing similar to that described with reference to FIG. 1. A periodic array of conducting cylinders, or vias 11 extend from the RF ground plane 10 to the upper surfaces of the stub walls 12, in order to ensure electrical contact between the walls of the lid and ground plane 10 and to provide RF isolation between the RF tracks 6 and 7 and the housing when assembled. Further stub walls 13 may be formed on the lower surface of the substrate with additional vias extending between ground plane 10 or further internal ground planes (not shown) and toward the lower bottom surface of stub wall 13 as shown.

After the ceramic substrate is fired, the surfaces thereof, including those of the stub walls 12 and 13, become distorted to some certain degree, as described earlier. Consequentially, the planes of the surfaces of the individual stub walls 12 and 13 will not be parallel relative to each other and will not be uniform as is desired to avoid problems on curing of the adhesive to fix the substrate to its housing. The upper and lower surfaces of the ceramic substrate are then mechanically ground, lapped and, if necessary, polished in the conventional way. However, since the stub walls 12 and 13 protrude from the substrate, the grinding and polishing tools make contact with the surfaces of these stub walls 12 and 13 only, rather than with the entire substrate surface and these areas are processed until the planes of the surfaces of all the stub walls 12 and 13 are coincidentally parallel with improved uniformity, as is indicated by the dashed line. Since the area of the substrate to be processed is minimised, problems with dishing and erosion are alleviated.

It should be understood that the clearance height of the stub walls 12 and 13 (i.e. the distance the stub walls 12 and 13 protrude from the planar surface of the substrate) will depend on the size and the type of substrate being processed. For example, for a 100 mm square tile HTCC substrate, one would typically expect surface distortion in the order of 0.3 mm. For a similar sized LTCC formed substrate, surface distortions in the range of 0.6 mm to 0.9 mm are typical. Therefore, since the integral stub walls themselves will be subject to a similar level of distortion on firing of the substrate, it follows that the minimum height of the stub walls must be greater that the typical surface distortion experienced by a similarly sized and formed substrate. An arbitrary selection of a clearance height for the stub walls of twice the typical value of the expected surface distortion of a similarly sized and similarly formed substrate has been found adequate to ensure effective processing. These typical values of surface distortion are determined by measurement. However, it should be understood that other clearance heights for the stub walls may be selected.

Figure 3:
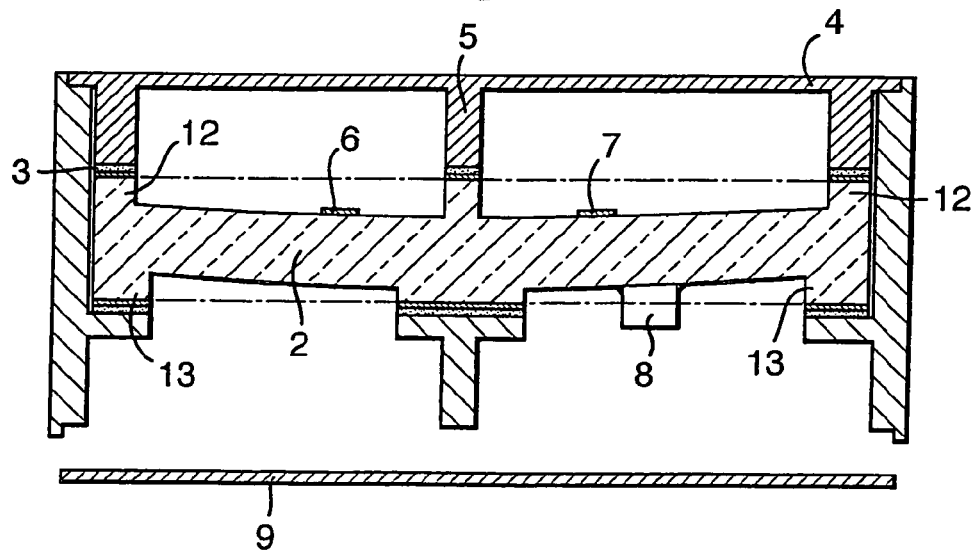

The parallel and uniform substrate surface can be further processed so as to provide a conducting surface forming an outer ring track and inner wall track in communication with the periodic array of conducting cylinders or vias. This allows the clamping lids, or frame, 4 to be bonded 3, using the conductive adhesive process, avoiding the cracking and stress problems described previously. The assembled structure is illustrated in FIG. 3.

It should be understood that the use of metal housings does not exclude other means of manufacture which are not implicitly constructed of solid base metals, but which make use of non-conducting materials together with exterior metallisations so as to provide the desired electrical screening. In addition, the invention also applies to housings without internal walls, or webs, so as to provide internal sectional electrical isolation.

The present invention provides a technique of achieving multi-layer ceramic substrates, of any convenient size, packaged within a metal housing that is not only mechanically robust but also provides the necessary electrical properties that are often critical at high radio frequencies. The structures are particularly suitable for use in the electronic modules of satellite communications payloads but may be used in various other applications.

The invention claimed is:

1. A method of assembling a packaged high frequency circuit module including the steps of:
   providing a ceramic substrate;
   firing the ceramic substrate; to form one or more elongate stub walls projecting from a planar surface of the substrate
   processing the fired substrate until the planar surface of the one or more elongate stub walls is uniform and parallel;

applying a conductive adhesive to the processed surfaces of the one or more stub walls; and placing a housing lid over the substrate, the lid having one or more members projecting from a planar surface thereof so that the one or more members align with the one or more stub walls of the substrate to form a composite structure.

2. The method according to claim 1, wherein the one or more stub walls extends, at least partially, around the periphery of the planar surface of the substrate.

3. The method according to claim 2, wherein one or more elongate stub walls project from an inner wall track of the substrate.

4. The method according to claim 2, wherein the projection of the one or more stub walls from the planar surface of the substrate is proportional to predetermined surface distortion values for the substrate.

5. The method according to claim 2, wherein processing a surface of the substrate comprises one or more of grinding, lapping or polishing the surface.

6. The method according to claim 1, wherein the one or more stub walls project from an inner wall track of the substrate.

7. The method according to claim 6, wherein processing a surface of the substrate comprises one or more of grinding, lapping or polishing the surface.

8. The method according to claim 6, wherein the projection of the one or more stub walls from the planar surface of the substrate is proportional to predetermined surface distortion values for the substrate.

9. The method according to claim 1, wherein the projection of the one or more stub walls from the planar surface of the substrate is proportional to predetermined surface distortion values for the substrate.

10. The method according to claim 9, wherein processing a surface of the substrate comprises one or more of grinding, lapping or polishing the surface.

11. The method according to claim 1, wherein processing a surface of the substrate comprises one or more of grinding, lapping or polishing the surface.

12. The method according to claim 1, further comprising the steps of applying pressure to the composite structure and curing the conductive adhesive.

13. The method according to claim 1, wherein the one or more elongate stub walls project from an upper planar surface of the substrate.

14. The method according to claim 1, wherein the one or more elongate stub walls project from a lower planar surface of the substrate.

15. The method according to claim 1, wherein the one or more elongate stub walls are integrally formed on the ceramic substrate.

16. The method according to claim 1, wherein the one or more elongate stub walls are formed on the ceramic substrate such that during the processing step, processing tools make contact with the surfaces of the one or more stub walls and not with the planar surface of the substrate in order to minimize the area of the substrate that is processed.

* * * * *

UNITED STATES PATENT AND TRADEMARK OFFICE
CERTIFICATE OF CORRECTION

| | |
|---|---|
| PATENT NO. | : 7,640,647 B2 |
| APPLICATION NO. | : 10/567377 |
| DATED | : January 5, 2010 |
| INVENTOR(S) | : Simon Leonard Rumer |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 325 days.

Signed and Sealed this

Twenty-first Day of December, 2010

David J. Kappos
*Director of the United States Patent and Trademark Office*